United States Patent [19]
Leluan et al.

[11] Patent Number: 6,001,419
[45] Date of Patent: Dec. 14, 1999

[54] CHEMICAL VAPOR INFILTRATION METHOD WITH VARIABLE INFILTRATION PARAMETERS

[75] Inventors: Jean-Luc Leluan, Bordeaux; Jean-Luc Domblides, Bruges; Bernard Delperier, Martignas sur Jalles; Jacques Thebault, Bordeaux; Jean-Marie Toussaint, Bouliac, all of France

[73] Assignee: Societe Nationale d'Etude et de Construction de Moteurs d'Aviation, Paris, France

[21] Appl. No.: 08/930,743

[22] PCT Filed: Apr. 9, 1996

[86] PCT No.: PCT/FR96/00530

§ 371 Date: Oct. 6, 1997

§ 102(e) Date: Oct. 6, 1997

[87] PCT Pub. No.: WO96/31447

PCT Pub. Date: Oct. 10, 1996

[30] Foreign Application Priority Data

Apr. 7, 1995 [FR] France .................... 95 04157

[51] Int. Cl.$^6$ ...................................... C23C 16/00
[52] U.S. Cl. .................... 427/249.2; 427/255.12
[58] Field of Search ................... 427/248.1, 249, 427/249.2, 255.12

[56] References Cited

U.S. PATENT DOCUMENTS

| | | | |
|---|---|---|---|
| 5,045,356 | 9/1991 | Uemura et al. | 427/249 |
| 5,348,774 | 9/1994 | Golecki et al. | 427/543 |
| 5,738,908 | 4/1998 | Rey et al. | 427/249 |
| 5,789,026 | 8/1998 | Delperier et al. | 427/249 |
| 5,846,611 | 12/1998 | Christin | 427/543 |
| 5,853,485 | 12/1998 | Rudolph et al. | 118/715 |

*Primary Examiner*—Roy V. King
*Attorney, Agent, or Firm*—Weingarten, Schurgin, Gagnebin & Hayes LLP

[57] ABSTRACT

Between the start and the end of the chemical vapor infiltration process, infiltration conditions are modified by causing at least one of the following infiltration parameters to vary: retention time of the gas, pressure, temperature, concentration of precursor in the gas, and concentration of dopant, if any, in the gas; thereby adapting infiltration conditions to changes in the porometry of the substrate in order to control the microstructure of the material deposited within the substrate, in particular in order to conserve a microstructure that is constant.

8 Claims, No Drawings

CHEMICAL VAPOR INFILTRATION METHOD WITH VARIABLE INFILTRATION PARAMETERS

This application is a national stage of PCT/FR96/00530 filed Apr. 9, 1996.

FIELD OF THE INVENTION

The present invention relates to a method for chemical vapor infiltration of a material into a porous substrate.

A field of application of the invention lies in making composite material parts comprising a fibrous reinforcing substrate or "preform" that is densified by a matrix, and in particular parts made of carbon-carbon composite material (carbon fiber preform and carbon matrix) or parts made of ceramic matrix composite (CMC).

BACKGROUND OF THE INVENTION

CMC and carbon-carbon composite materials are used in various fields where their thermostructural properties, i.e. their very good mechanical properties, make it possible to build structural elements that are heavily stressed, and that have the ability to retain these mechanical properties even at relatively high temperatures. This applies, for example, in the field of space, in particular for panels providing thermal protection or nozzles for thrusters, in the field of aviation, e.g. for parts of airplane jets, and in the field of friction, in particular for airplane brake disks.

Chemical vapor infiltration of a material into a porous substrate consists in placing the substrate inside an enclosure, in causing a gas to diffuse within the accessible internal pores of the substrate, which gas contains at least a precursor of the material in the gaseous state, and simultaneously in controlling in particular the temperature and the pressure inside the enclosure so that a deposit is formed from the precursor throughout the volume of the substrate. The precursor for carbon can be an alkane, an alkyl, or an alkene, giving rise to pyrolytic carbon by decomposition. For chemical vapor infiltration of a ceramic material, a gas is diffused that contains one or more gaseous species giving the desired ceramic material by decomposition or by mutual chemical reaction. Thus, for example, chemical vapor infiltration of silicon carbide (SiC) can be obtained by means of a gas containing methyltrichlorosilane (MTS) and in the presence of hydrogen gas ($H_2$). Gaseous species that are precursors for other ceramics such as carbides, nitrides, or oxides are well known to the person skilled in the art.

Several vapor infiltration methods exist, in particular isobaric methods that are isothermal and isobaric methods that have a temperature gradient.

In isothermal isobaric methods, the substrates to be densified are maintained at all times at uniform temperature throughout their volume and under uniform pressure. A drawback thereof lies in the impossibility, in practice, of obtaining densification that is uniform. The matrix material tends to deposit preferentially within pores close to the outside surface of the substrate. The progressive obstruction of the surface pores makes access for the gas to the inside of the material more and more difficult, resulting in a gradient of densification between the surface and the core of the material. It is of course possible to descale or machine the surface of the substrate one or more times during the densification process in order to open up surface pores. However that requires the process to be interrupted for the time required to extract the substrate from the densification installation, to cool it down, to descale it, to put the substrate back into the installation, and to return to the desired temperature.

With a temperature gradient type method, the abovementioned drawback of the isothermal method can be limited to a great extent. A temperature difference is established between a hotter inner portion and a cooler surface of the substrate which is exposed to the gas. The matrix material then deposits preferentially in the hotter inner portion. By controlling the temperature of the substrate surface so that it is below the decomposition or reaction threshold of the gas, at least during an initial portion of the densification process, it is possible to ensure that the densification front progresses from the inside towards the surface of the substrate as the process continues. In conventional manner, the temperature gradient can be obtained by placing one or more substrates around a susceptor coupled to an inductor with an inside face of the substrate(s) in contact with the susceptor. It is also possible to obtain a temperature gradient by direct inductive coupling with the substrate being densified, when the nature of the substrate makes that possible. Those techniques are described in particular in the documents FR-A-2 711 647 and U.S. Pat. No. 5,348,774. In the latter document, the substrates are heated both by coupling with a susceptor and by direct coupling with the substrates as the densification front progresses. Means are provided to measure variation in the weight of the substrates continuously so as to monitor the progress of the densification process. As a function of the measured weight variation, the process can be optimized, in particular concerning its duration, by acting on densification parameters, and in particular on the power supplied to the inductor. Monitoring variation in substrate weight also makes it possible to define the end of the densification process. The temperature gradient method does indeed make it possible to obtain densification that is more uniform than with the isothermal process, but it can only be implemented with substrates of a particular shape, in particular substrates that are annular.

Whatever the densification method used, the microstructure of the material deposited within the substrate depends on the conditions under which chemical vapor infiltration takes place. For example, with pyrolytic carbon, by modifying these infiltration conditions, it is possible, in particular, to obtain pyrolytic carbon of the smooth laminar type, of the dark laminar type, of the rough laminar type, or of the isotrophic type. The microstructure of pyrolytic carbon is a characteristic that is important with respect to the properties of the densified substrate. Thus, for parts made of carbon-carbon composite, it is often desirable to have a microstructure of the rough laminar type, in particular because of its ability to be graphited by heat treatment. Controlling the microstructure of the material deposited within the substrate is also important for a material of the ceramic type.

In isothermal densification methods, it has been observed that in spite of the infiltration parameters being fixed initially so as to give a deposit having the desired microstructure, the microstructure can vary during the densification process. The difficultly of conserving uniform microstructure is to be observed in particular when densifying thick substrates such as fiber preforms that are more than 5 cm thick.

The same difficulty exists with temperature gradient densification methods, whether by inductive coupling with a susceptor in contact with the substrates or by inductive coupling directly with the substrates.

OBJECT AND SUMMARY OF THE INVENTION

An object of the present invention is to remedy that drawback and to provide a chemical vapor infiltration method enabling a porous substrate to be densified with a material of controlled microstructure.

According to the invention, this object is achieved by a method which comprises placing the poros substrate in an enclosure, introducing the gas into the enclosure, exhausting residual gas from the enclosure, and controlling infiltration conditions defined by a set of parameters including: the gas retention time between introduction into the enclosure and exhaustion from the enclosure, the pressure within the enclosure, the temperature of the substrate, the concentration of the precursor in the gas, and the concentration of any dopant in the gas, wherein said infiltration conditions are modified during the course of the infiltration process by varying at least one of said parameters between a first value at the start of the infiltration process and a second value different from the first value during or a the end of the infiltration process, with said gas retention time, if varied, being increased from a first to a second value, with said temperature, if varied, being decreased from a first to a second value, with said precursor concentration, if varied, being decreased from a first to a second value and with said dopant concentration, if varied, being decreased from a first to a second value, thereby adapting the infiltration conditions to changes in the porometry of the substrate.

The term "precursor" is used herein to mean the component or components of the gas which, under the selected operating conditions, cause the desired material to be deposited within the substrate.

As already mentioned, when depositing pyrolytic carbon, precursors are specifically alkanes, alkyls, and alkenes. The term "dopant" is used herein to designate the component or the components of the gas which serve to activate the deposition of carbon from the precursor, under the selected operating conditions. The dopant may also constituted a precursor. Thus, for example, in a gas comprising a mixture of methane and of propane (both of which are precursors), the propane acts as a dopant when the temperature is about 1000° C. and the pressure is about 1.3 kPa. Other dopants, and not necessarily precursors, can be used instead of, or together with, propane, acting as activators on gases that are less reactive under the above-mentioned infiltration conditions (increasing the reactivity of methane, for example). At higher temperatures and pressures, e.g. at a temperature of about 1100° C., and a pressure of about 6.5 kPa (50 Torr), methane acts as a precursor without requiring the presence of a dopant.

The term "porometry" is used herein to designate that which characterizes the pore size of the substrate and more particularly the shape of the pores. For example, it will appear immediately to the person skilled in the art that a substrate that is highly porous, but in which the pores communicate little, can give rise to substantially the same problems in densification as a substrate that is not very porous but in which the pores communicate thoroughly, in which case the porometries are considered as being similar.

DETAILED DESCRIPTION OF PREFERRED EMBODIMENTS

It is common practice in the art to implement chemical vapor infiltration processes with infiltration parameters that are predefined from one end to the other of the process independently of the porometry of the substrate. This is true in particular of isothermal isobaric methods. The infiltration parameters are generally selected to obtain a desired final specific gravity which makes it possible to continue with densification as much as possible at the end of the process, given the requirement, even though porometry is then unfavorable to diffusion of the gas into the core of the substrate.

In temperature gradient type methods, there does indeed exist a temperature difference between an inner zone of the substrate being densified and the exposed surfaces of the substrate, with the densification front moving from the inside towards the surface. Nevertheless, in similar manner to the isothermal method, the temperature in the densification zone is controlled and maintained substantially constant at the optimum value as determined for optimum densification.

The Applicant has consequently observed, surprisingly, that chemical vapor infiltration performed with a high precursor concentration throughout the infiltration process, i.e. a concentration that is much greater than that commonly used, leads to the formation of a deposit having constant microstructure. However, and particularly with isothermal methods, there then appears in unexpected manner a steep densification gradient, the densification of the substrate in the core being much less than in the vicinity of the surface. This densification gradient becomes steeper with increasing infiltration temperature.

Unfortunately, it is necessary for the microstructure of the deposit to be controlled not only to achieve the properties expected of the densified substrate, but also for the purpose of minimizing densification non-uniformities between the core and the surface of the substrate.

Progressively adapting the infiltration parameters throughout the densification process as a function of changes in the porometry of the substrate satisfies these requirements. Also, compared with known methods using fixed parameters, such progressive adaptation leads to a significant saving in the total duration of densification.

When it is desired to conserve microtexture constant, it is advantageous for infiltration conditions to be modified by varying at least the concentration of the precursor and/or of the dopant from a first value at the beginning of the infiltration process to a second value, lower than the first, at the end of the infiltration process.

The concentration of the main precursor and/or of the dopant is selected to be as high as possible during the process. Thus, for example, in isothermal densification with pyrolytic carbon by chemical vapor infiltration from a gas comprising a mixture of methane or natural gas and propane, the concentration of propane, where propane is both the main precursor and a dopant, can change from a value that is preferably not less than 20%, which is the highest value used at the beginning of the process, to a value and a dopant, can change from a value that is preferably not less than 20%, which is the highest value used at the beginning of the process, to a value preferably lying in the range 6% to 20% which is the lowest value used at the end of the process. In this case, concentration is measured as a volume percentage in the gas. There is no advantage in selecting a value greater than 35% for the highest volume concentration of propane at the beginning of the process, since deposition kinetics are increased very little thereby.

Other parameters can be modified to conserve constant microtexture, whether or not the precursor concentration is constant. This applies to temperature and to pressure. Thus, still in the context of isothermal densification with gas comprising a mixture of methane or natural gas, and propane, and for the purpose of obtaining a microstructure of the rough laminar type, the densification temperature can be decreased from a first value, e.g. equal to not less than about 1020° C., to a second value, lower than the first and lying, for example, in the range about 950° C. to 1020° C., said second value being selected so that deposition kinetics are not too slow, with the deposition temperature threshold being about 860° C. in this example. Still in the same example, the pressure can be decreased from a first value equal, for example, to about 2.5 kPa, to a second value which is less than the first, and lies, for example, in the range about 0.5 kPa to about 2 kPa, and can then be increased again to a third value, e.g. more than 3 kPa.

It is also possible to modify the retention time of the gas. When the gas is introduced into the enclosure in which the substrate is placed, and when the residual gas is exhausted from said enclosure in continuous manner, then the retention time is taken as being the mean time required for gas to flow from the inlet of the enclosure to the outlet therefrom, i.e. the time spent in the hot portion of the installation; retention time then depends on the flow rate of the gas and on the volume it can occupy inside the enclosure (which is a function of temperature, pressure, of the volume of the substrate, . . . ). When infiltration is performed in pulsed manner, i.e. in successive cycles, each comprising admitting a determined quantity of gas into the enclosure and exhausting residual gas by connecting the enclosure to a vacuum, the retention time is the time that elapses between the beginning of admission and the beginning of exhaustion. Preferably, if the gas retention time is caused to vary during the infiltration process, then the variation is in the increasing direction.

The infiltration parameter(s) can be caused to vary continuously throughout the infiltration process, or a portion thereof, or in discontinuous manner.

The infiltration process can be subdivided into a plurality of successive stages that are separated from one another, in conventional manner, by descaling operations consisting, as already mentioned, in machining the surface to eliminate surface deposits so as to fully reopen access for the gas to the pores within the substrate. Under such circumstances, the infiltration parameters can be modified discontinuously by defining a new set of parameter values for a new densification stage. It is not necessary for parameter modification to be applied for each new stage.

It will also be observed that the present invention can be implemented by using various types of chemical vapor infiltration method, such as methods of the isobaric and isothermal type and methods of the temperature gradient type.

It will also be observed that controlling the microstructure of the deposit can consist not only in maintaining a microstructure that is uniform throughout the deposited matrix, which will usually be the desired objective, but also in causing the microstructure to vary in predetermined manner during the densification process.

Thus, by way of example, when considering the case of temperature gradient type densification by means of pyrolytic carbon obtained from gas comprising a mixture of propane and of methane or natural gas, various pyrolytic carbon microstructures can be deposited in succession by varying the infiltration parameters. In this example, the following table gives ranges of values for infiltration parameters that are suitable for obtaining pyrolytic carbons of rough laminar type, of dark laminar type, and of smooth laminar type.

| Type of pyrolytic carbon | Propane Concentration | Pressure (kPa) | Temperature (° C.) | Retention time (s) |
| --- | --- | --- | --- | --- |
| Rough laminar | >6% | >0.5 ≦3.3 | >850 ≦1050 | ≧0.1 <10 |
| Dark laminar | >6% | >3.3 <100 | >800 ≦1050 | ≧0.1 <500 |
| Smooth laminar | >6% | >0.5 ≦3.3 | >1050 <1250 | ≧0.1 <10 |

The deposition conditions given in the above table for smooth laminar type pyrolytic carbon are also applicable to isothermal densification. Conserving a constant smooth laminar microstructure throughout deposition can then require one or more parameters to be varied in the ranges given during the densification process.

Examples of implementing the method of the invention are given below by way of non-liming indication.

EXAMPLE 1

A porous substrate constituted by a fibrous preform was made of carbon fibers as follows. Plies of preoxidized polyacrylonitrile (PAN) fiber cloth measuring 250 mm×250 mm were cut out and stacked, being bonded to one another by needling. The needling was performed as the preform was built up, with each ply being needled on the underlying structure, and needling specific gravity was maintained substantially uniform throughout the preform, as described in particular in document FR-A-2 584 106.

The preform obtained in this way was subjected to heat treatment to transform the preoxidized PAN into carbon, and then to densification by chemical vapor infiltration by being placed in a reaction chamber of an infiltration oven. The isothermal type infiltration process was performed in four stages. At the end of each stage and before the beginning of the following stage, the preform was removed from the oven and subjected to a descaling operation consisting in eliminating the pyrolytic carbon that had accumulated on the surface of the preform, in order to reopen access to the internal pores thereof and facilitate continuing densification.

The gas admitted into the reaction chamber was constituted by a mixture of propane and of natural gas (essentially methane) flowing continuously from the inlet to the outlet of the chamber. The retention time of the gas in the chamber was about 1 second (s), and the pressure in the chamber was maintained at a value of about 1.3 kPa (10 Torr). During each stage of the infiltration process, the temperature was kept constant and equal to about 980° C.

Infiltration conditions were modified solely by modifying the parameter which constitutes propane concentration (main precursor of carbon and dopant) in the gas.

For each of four stages I to IV of the infiltration process, the table below gives the duration of the stage and the concentration of propane as a volume percentage in the mixture of natural gas and propane.

|  | Stage I | Stage II | Stage III | Stage IV | Total |
| --- | --- | --- | --- | --- | --- |
| Duration (h) | 260 | 260 | 400 | 400 | 1320 |
| Propane concentration (%) | 20 | 20 | 10 | 6 |  |

The propane concentration was modified in steps, going from 20% in stage I to 6% in stage IV.

At the end of the infiltration process, the relative mass uptake of the preform i.e. the ratio of its increase in mass over its initial mass, was 220%. Examination of a section made through the densified preform revealed a microstructure that was substantially uniform, of the rough laminar type, and extending to the core of the preform.

EXAMPLE 2

A preform was used identical to that of Example 1. Pyrolytic carbon infiltration was likewise performed in four stages separated by descaling, and using a gas constituted by a mixture of natural gas and of propane. The retention time of the gas was about 1 s, and the pressure was about 1.3 kPa.

In this case, modification of infiltration conditions related to two parameters: temperature and propane concentration, and it was performed continuously. For each of the stages I to IV of the infiltration process, the table below gives the duration, the temperature at the start of the stage, the temperature at the end of the stage, the propane concentration at the beginning of the stage, and the propane concentration at the end of the stage. It will be observed that temperature was modified continuously only during stages I and II, whereas the propane concentration was modified continuously only during stages III and IV. Temperature was varied from its highest value (1050° C.) to its lowest value (980° C.) in substantially linear manner. Propane concentration was likewise varied in substantially linear manner from its highest value (20% in volume percentage) and its lowest value (10%). It may be observed that the process was of the isothermal type, temperature being uniform throughout the preform at all times.

At the end of the infiltration process, the relative mass uptake was about 220%. Densification to the core of the preform had substantially the same characteristics as those observed in Example 1, however the total duration of the densification process was considerably reduced.

|  | Stage I | Stage II | Stage III | Stage IV | Total |
| --- | --- | --- | --- | --- | --- |
| Duration (h) | 80 | 160 | 350 | 400 | 990 |
| Start temperature (° C.) | 1050 | 1016 | 980 | 980 |  |
| End temperature (° C.) | 1016 | 980 | 980 | 980 |  |
| Start propane concentration (%) | 20 | 20 | 20 | 15 |  |
| End propane concentration (%) | 20 | 20 | 15 | 10 |  |

EXAMPLE 3

(Comparative Example)

A preform was used identical to that of Example 1. Pyrolytic carbon densification was performed in four stages of the following durations respectively: 500 hours (h), 500 h, 400 h, and 400 h, separated by descaling. Infiltration conditions were maintained unchanged throughout the entire infiltration process, i.e. the gas was constituted by a mixture of natural gas and of propane with the volume concentration of the propane being 6%, the gas had a retention time of about 1.8 s, the pressure was 1.5 kPa, and the temperature 980° C.

Those parameters, and also the durations of the infiltration stages, are optimum values as has been determined by the Applicant for implementing a conventional chemical vapor infiltration process, i.e. a process using constant parameters, giving rise to densification similar to that obtained in Examples 1 and 2. The relative mass uptake was the same (220%), however the pyrolytic carbon microstructure was not at all uniform.

It can be seen that the present invention provides the considerable advantage, industrially speaking, of dividing the total duration of densification by 1.36 (Example 1) and by 1.82 (Example 2), while achieving a result that is the same as the result of the prior art process in terms of degree of densification, but that conserves a microstructure that is uniform throughout infiltration.

EXAMPLE 4

The fiber preform was a disk having a diameter of 250 mm and a thickness of 30 mm, made by stacking and needling plies of cloth as described in Example 1.

The preform was densified with pyrolytic carbon by chemical vapor infiltration starting from a gas constituted by a mixture of natural gas and of propane, at a temperature of 1015° C., and at a pressure of 1.5 kPa.

The infiltration process was performed in two stages I and II, separated by an intervening descaling operation. For each of the two stages, the table below gives the duration of the stage, the volume concentration of the propane, and the retention time of the gas.

|  | Stage I | Stage II | Total |
| --- | --- | --- | --- |
| Duration (h) | 350 | 500 | 850 |
| Propane concentration (volume %) | 20 | 6 |  |
| Retention time (s) | 1 | 1.8 |  |

At the end of the infiltration process, the relative mass uptake was about 250%, the densification was substantially uniform, and the microstructure of the rough laminar type pyrolytic carbon was uniform.

EXAMPLE 5

A preform was used identical to that of Example 4. Infiltration by pyrolytic carbon was likewise performed in two stages separated by descaling and using a gas constituted by a mixture of natural gas and propane at a precursor of 1.5 kPa. For each of the two stages, the table below gives the duration of the stage, the volume concentration of the propane (constant during each stage), the start and end values of temperature (continuous variation), and the start and end retention time values (continuous variation).

|  | Stage I | Stage II | Total |
| --- | --- | --- | --- |
| Duration (h) | 200 | 300 | 500 |
| Propane concentration (volume %) | 20 | 6 |  |
| Start temperature (° C.) | 1050 | 1030 |  |
| End temperature (° C.) | 1030 | 1015 |  |
| Start retention time (s) | 1 | 1.2 |  |
| End retention time (s) | 1.2 | 1.8 |  |

The total mass uptake was 250%, and the pyrolytic carbon matrix had the same characteristics as in Example 4.

EXAMPLE 6

(Comparison)

A preform was used identical to that of Example 4. Infiltration was performed in two stages separated by descaling and using a gas constituted by a mixture of natural gas and of propane. Infiltration conditions were maintained unchanged throughout the infiltration process, i.e. the volume concentration of propane in the gas was 6%, the temperature was 1015° C., the retention time was 1.8 s, and the pressure 1.5 kPa.

The duration of each stage was 500 h, giving rise to densification with a mass uptake of 250%, as in Examples 4 and 5.

Examples 4 and 5 show that while providing a uniform microstructure for the deposited pyrolytic carbon, the invention also makes it possible to reduce very significantly the total duration of densification (duration divided by 1.18 and by 2 compared with that of Example 6).

EXAMPLE 7

A porous substrate constituted by a fiber preform, essentially of silicon carbon (SiC) fibers was made by stacking plies of plain weave cloth having threads constituted by fibers sold by Nippon Carbon under the name "Nicalon". The cloth plies were stacked and compressed in tooling to obtain a preform in which 35% of its volume was occupied by fibers, and whose thickness was 5 mm.

The preform was densified with silicon carbide obtained by chemical vapor infiltration in a reaction chamber of an infiltration oven. An isothermal type infiltration process was performed in three stages I to III. At the end of the first stage, the preform was removed from the oven to allow the tooling to be dismantled, since SiC deposition was by then sufficient to ensure that the preform was consolidated, i.e. sufficient to bind the fibers together enough to ensure that the preform retained its shape. No descaling was performed between densification stages.

The gas admitted into the chamber was constituted by a mixture of methyltrichlorosilane (MTS) gas, a precursor of SiC, and of hydrogen gas ($H_2$). The retention time of the gas in the chamber was equal to about 10 s, and the pressure in the chamber was maintained at a value of about 13 kPa (100 Torr).

Infiltration conditions were modified solely by modifying temperature. For each of stages I to III, the table below gives the duration of the stage, its temperature, which was maintained constant throughout each stage, and the specific gravity of the preform at the end of each stage.

|  | Stage I | Stage II | Stage III | Total |
|---|---|---|---|---|
| Duration (h) | 70 | 70 | 70 | 210 |
| Temperature (° C.) | 1050 | 1030 | 1010 |  |
| Specific gravity | 1.9 | 2.3 | 2.5 |  |

EXAMPLE 8

(Comparison)

A preform identical to that of Example 7 was used. SiC infiltration was performed in two stages I and II, comprising a consolidation first stage during which the preform was removed from the tooling, and a second stage during which densification was continued until a degree of densification was reached substantially identical to that reached in Example 7.

The gas used and the infiltration conditions were the same as in Example 7, with the exception of temperature being maintained constant throughout the process, as indicated in the table below. The table also gives the durations of stages I and II, the total duration, and the resulting densities. It can be seen that to achieve the same final degree of densification (specific gravity 2.5), the total duration of the process was substantially longer than that of Example 7, with the saving in total duration achieved by varying the temperature variable being 25% in this case.

|  | Phase I | Phase II | Total |
|---|---|---|---|
| Duration (h) | 70 | 210 | 280 |
| Temperature (° C.) | 1010 | 1010 |  |
| Specific gravity | 1.5 | 2.5 |  |

EXAMPLE 9

Fiber preforms of the kind used in Example 4 were stacked on a common axis while being slightly spaced apart from one another by means of spacers. The preforms were placed in a reaction chamber of an infiltration oven around a susceptor constituted by a cylindrical block of graphite with which their inside surfaces were in contact. The susceptor was heated by inductive coupling using an inductor situated outside the chamber, such that a thermal gradient was established between the inside faces of the preforms and their outside faces exposed to the gas injected into the oven. The preforms were densified with pyrolytic carbon by using a mixture of natural gas and of propane. The surface temperature of the preforms was measured and regulated to the desired value by controlling the current through the inductor, as described in document WO-A-95/11868.

Pyrolytic carbon infiltration conditions were modified during the densification process as follows.

|  | Start | Finish |
|---|---|---|
| Surface temperature (controlled) | 550° C. | 980° C. |
| Propane concentration | 20% | 20% |
| Pressure | 2.5 kPa | 2.5 kPa |

Rough laminar type pyrolytic carbon densification was obtained at all points in the parts made.

EXAMPLE 10

The procedure was the same as in Example 9, but the pyrolytic carbon infiltration conditions were modified as follows.

|  | Start | Middle | End |
|---|---|---|---|
| Surface temperature (controlled) | 550° C. | 700° C. | 950° C. |
| Propane concentration | 20% | 20% | 15% |
| Pressure | 2.5 kPa | 2.5 kPa | 80 kPa |

The microstructure of the pyrolytic carbon in the matrix varied as the densification front progressed from the cores of the preforms towards the outer surfaces thereof. In the cores of the resulting parts, the pyrolytic carbon matrix was of the pure rough laminar type, and it varied progressively towards the pure dark laminar type going outwards, in contact with the fibers, and passing through a mixture of rough laminar with dark laminar.

We claim:

1. A chemical vapor infiltration method for infiltrating a same material into a porous substrate by means of a gas containing at least a precursor of said material in the gaseous state, said method comprising placing the porous substrate in an enclosure, introducing the gas into the enclosure, exhausting residual gas from the enclosure, and controlling infiltration conditions defined by a set of parameters including: the gas retention time between introduction into the enclosure and exhaustion from the enclosure, the pressure within the enclosure, the temperature of the substrate, the concentration of the precursor in the gas, and the concentration of any dopant in the gas, wherein said infiltration conditions are controllably modified during the course of the infiltration process by varying at least one of said parameters between a first value at the start of the infiltration process and a second value different from the first value during or at the end of the infiltration process, with said gas retention time, if varied, being increased from a first to a second value, with said temperature, if varied, being decreased from a first to a second value, with said precursor concentration, if varied, being decreased from a first to a second value and with said dopant concentration, if varied, being decreased from a first to a second value, thereby adapting the infiltration conditions to changes in the porometry of the substrate; and wherein said same material is infiltrated as said infiltration conditions are controlled from a beginning to an end.

2. A method as claimed in claim 1, wherein said pressure within the enclosure, if varied, is caused to vary from a first value at the beginning of the infiltration process to a second value, lower than the first, during the infiltration process, and to a third value greater than the second, at the end of the infiltration process.

3. A method as claimed in claim 1, wherein the temperature throughout the substrate is uniform.

4. A method as claimed in claim 1, wherein a temperature gradient is generated throughout the substrate.

5. A method as claimed in claim 1, wherein said infiltration conditions are varied in a continuous manner.

6. A method as claimed in claim 1, wherein said infiltration conditions are varied in a discontinuous manner.

7. A method as claimed in claim 6, wherein the infiltration process is implemented in a plurality of successive stages, and modification of the infiltration conditions is performed at the beginning of at least one stage.

8. A method as claimed in claim 1 for chemical vapor infiltration of pyrolytic carbon by means of a gas mixture of methane and propane, wherein the volume concentration of propane in the gas is varied from a value of not less than 20% to a value lying in the range 6% to 20%.

* * * * *